US012596902B2

(12) United States Patent
Lin et al.

(10) Patent No.: US 12,596,902 B2
(45) Date of Patent: Apr. 7, 2026

(54) CARD HAVING A FINGERPRINT SENSOR AND MANUFACTURING METHOD OF THE SAME

(71) Applicant: ELAN MICROELECTRONICS CORPORATION, Hsinchu (TW)

(72) Inventors: Yu-Kai Lin, Hsinchu City (TW); Chien-Wen Tsai, Zhubei City (TW); Ta-Huang Liu, Hsinchu City (TW)

(73) Assignee: ELAN MICROELECTRONICS CORPORATION, Hsinchu (TW)

( * ) Notice: Subject to any disclaimer, the term of this patent is extended or adjusted under 35 U.S.C. 154(b) by 248 days.

(21) Appl. No.: 18/321,471

(22) Filed: May 22, 2023

(65) Prior Publication Data

US 2023/0394269 A1 Dec. 7, 2023

(30) Foreign Application Priority Data

Jun. 2, 2022 (TW) ................................. 111120701

(51) Int. Cl.
*G06K 19/07* (2006.01)
*G06V 40/13* (2022.01)
*H01L 21/48* (2006.01)
*H01L 23/13* (2006.01)
*H01L 23/498* (2006.01)

(52) U.S. Cl.
CPC ..... *G06K 19/0718* (2013.01); *G06V 40/1329* (2022.01); *H01L 21/481* (2013.01); *H01L 23/13* (2013.01); *H01L 23/49855* (2013.01)

(58) Field of Classification Search
CPC ....................... G06K 19/0718; G06V 40/1329
See application file for complete search history.

(56) References Cited

U.S. PATENT DOCUMENTS

| | | | | |
|---|---|---|---|---|
| 4,358,677 A | * | 11/1982 | Ruell | G06V 40/13 |
| | | | | 340/5.53 |
| 4,835,846 A | * | 6/1989 | Juan | G06K 19/07743 |
| | | | | 174/541 |
| 5,255,430 A | * | 10/1993 | Tallaksen | H01L 21/67144 |
| | | | | 174/536 |
| 6,182,892 B1 | | 2/2001 | Angelo et al. | |
| 9,147,100 B1 | * | 9/2015 | Lin | G06V 40/1329 |
| 2009/0153297 A1 | | 6/2009 | Gardner | |
| 2016/0125220 A1 | * | 5/2016 | Lundahl | H01L 23/26 |
| | | | | 382/124 |
| 2016/0247009 A1 | * | 8/2016 | Lu | H01L 23/49827 |
| 2017/0012142 A1 | * | 1/2017 | Lin | H10F 39/804 |
| 2017/0132448 A1 | * | 5/2017 | Wang | G06V 40/1306 |
| 2018/0330138 A1 | | 11/2018 | Suwald | |

(Continued)

FOREIGN PATENT DOCUMENTS

WO        WO99/34323 A1        7/1999

*Primary Examiner* — Sherman Ng
(74) *Attorney, Agent, or Firm* — patenttm.us

(57) ABSTRACT

A card having a fingerprint sensor and a manufacturing method of the same are provided. The fingerprint sensor is disposed between a substrate and a protection layer. The protection layer has a first area and a second area thereon. The roughness of the second area is smaller than the roughness of the first area. The second area corresponds to the sensing area of the fingerprint sensor. When the user's finger is wet, the second area may effectively keep the water from remaining on it. Thus, the water does not affect the effect of fingerprint sensing.

12 Claims, 10 Drawing Sheets

(56)          References Cited

U.S. PATENT DOCUMENTS

| | | | |
|---|---|---|---|
| 2019/0050623 | A1 | 2/2019 | Lavin et al. |
| 2019/0266378 | A1* | 8/2019 | Hsu .................... G06V 40/1329 |
| 2019/0266381 | A1 | 8/2019 | Hwang et al. |
| 2020/0125815 | A1* | 4/2020 | Lu ......................... H10K 77/111 |
| 2020/0184173 | A1* | 6/2020 | Jiang ................ G06K 19/07773 |
| 2021/0056276 | A1 | 2/2021 | Lu et al. |
| 2021/0407822 | A1 | 12/2021 | Lignier |
| 2022/0269918 | A1* | 8/2022 | Su ....................... G06V 40/1306 |
| 2022/0366718 | A1* | 11/2022 | Mueller ............. G06V 40/1306 |
| 2023/0359853 | A1* | 11/2023 | Skårbratt ......... G06K 19/07722 |

* cited by examiner

CARD HAVING A FINGERPRINT SENSOR AND MANUFACTURING METHOD OF THE SAME

CROSS-REFERENCE TO RELATED APPLICATIONS

This application is based upon and claims priority under 35 U.S.C. 119 from Taiwan Patent Application No. 111120701 filed on Jun. 2, 2022, which is hereby specifically incorporated herein by this reference thereto.

BACKGROUND OF THE INVENTION

1. Field of the Invention

The present invention relates to a card, especially a card with a fingerprint sensor for verifying the user's identity.

2. Description of the Prior Arts

People's daily life is filled with the use of many cards. The traditional card is only used as an information recording interface, such as the name of the card user, expiration date, etc. With the advancement of technology, cards are no longer traditional paper cards, but electronic recording media such as magnetic stripes, barcodes, and chips have been added. This enables the card to carry more information, and also reduces the chance of being forged, thereby increasing the utilization rate of the card. However, with the popularization of card use, the phenomenon of unscrupulous people stealing and using other people's cards gradually appears, and people inevitably lose their cards inadvertently. Therefore, the verification function of the card itself is also more important. In the prior art, a fingerprint sensor has been integrated into a card to provide the user with identity verification when using the card.

The surface of a conventional card in accordance with the prior art may be designed as a glossy or matte surface in accordance with the requirements of the card issuer for the card. The surface of the matte surface is a surface with high roughness. From a microscopic point of view, the height difference between the peaks and valleys of the surface is relatively large. When the surface of the card is matte, if the user's fingers are in a wet state (such as with sweat, after washing hands, or just moist), placing the fingers on the fingerprint sensing area for sensing may cause the peaks and valleys of the matte surface to retain moisture, which in turn affects the captured fingerprint image and reduces the sensitivity of the fingerprint sensor.

To overcome the shortcomings, the present invention provides a card with a fingerprint sensor to mitigate or to obviate the aforementioned problems.

SUMMARY OF THE INVENTION

The main objective of the present invention is to solve the problem of poor sensing when the user's fingers are wet.

To achieve the aforementioned objective, the present invention provides a card comprising: a main layer having a circuit; a fingerprint sensor disposed on the main layer, electrically connecting to the circuit of the main layer, and having a sensing area; and a protective layer covering the main layer and the fingerprint sensor and having a surface including a first area and a second area, wherein a surface roughness of the first area is greater than a surface roughness of the second area and the second area covers the sensing area of the fingerprint sensor.

Further, the present invention also provides a manufacturing method of a card comprising steps of: providing a main layer; disposing a fingerprint sensor on the main layer, wherein the fingerprint sensor has a sensing area; covering a protective layer on the main layer and the fingerprint sensor; and processing a surface treatment to a surface of the protective layer to form a first area and a second area, wherein the second area covers the sensing area of the fingerprint sensor, and a surface roughness of the first area is greater than a surface roughness of the second area.

Other objectives, advantages and novel features of the invention will become more apparent from the following detailed description when taken in conjunction with the accompanying drawings.

DETAILED DESCRIPTION OF THE EMBODIMENTS

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, or the actual ratio. Some of the dimensions or dimension ratios have been enlarged or simplified to provide a better illustration. The actual numbers, actual shapes, or actual dimension ratios can be selectively designed and disposed and the detailed component layouts may be more complicated.

Figure 1:
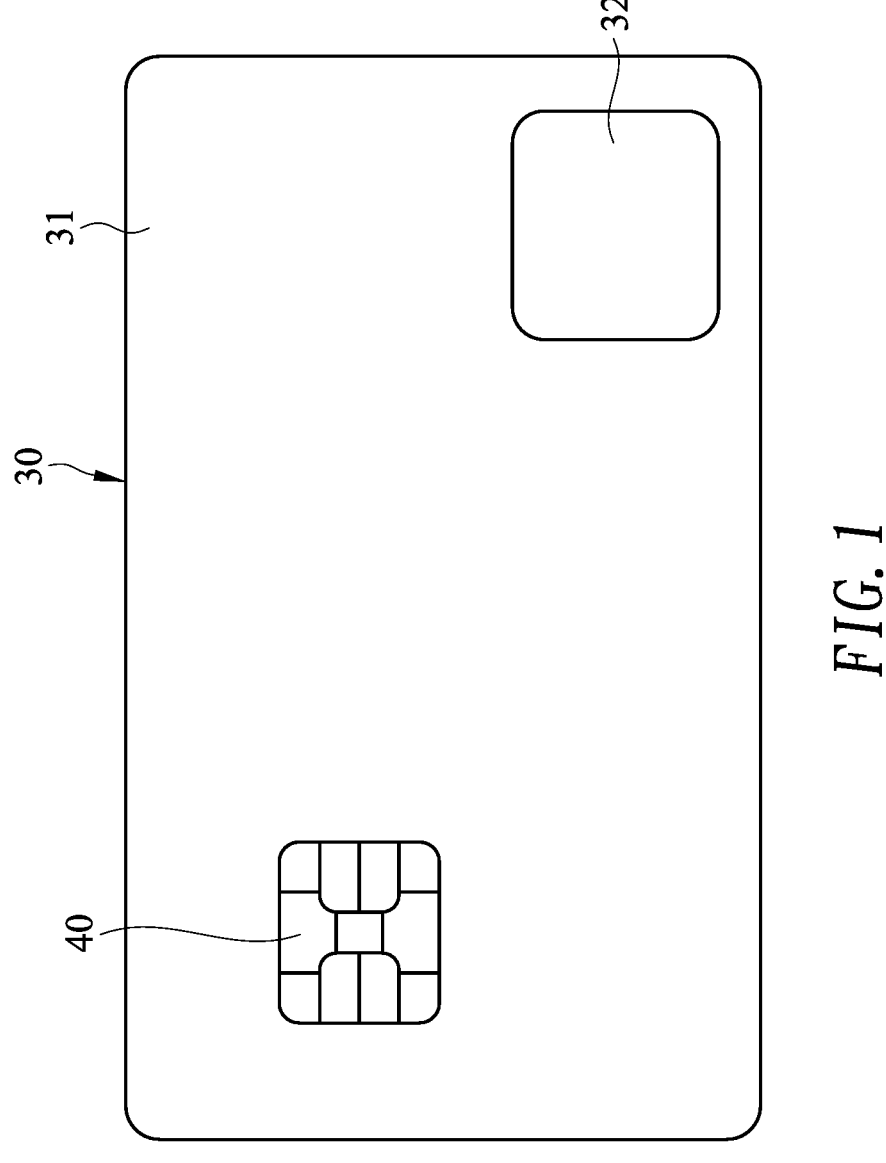
FIG. 1 is a top view of a first embodiment of a card in accordance with the present invention.
Figure 2:
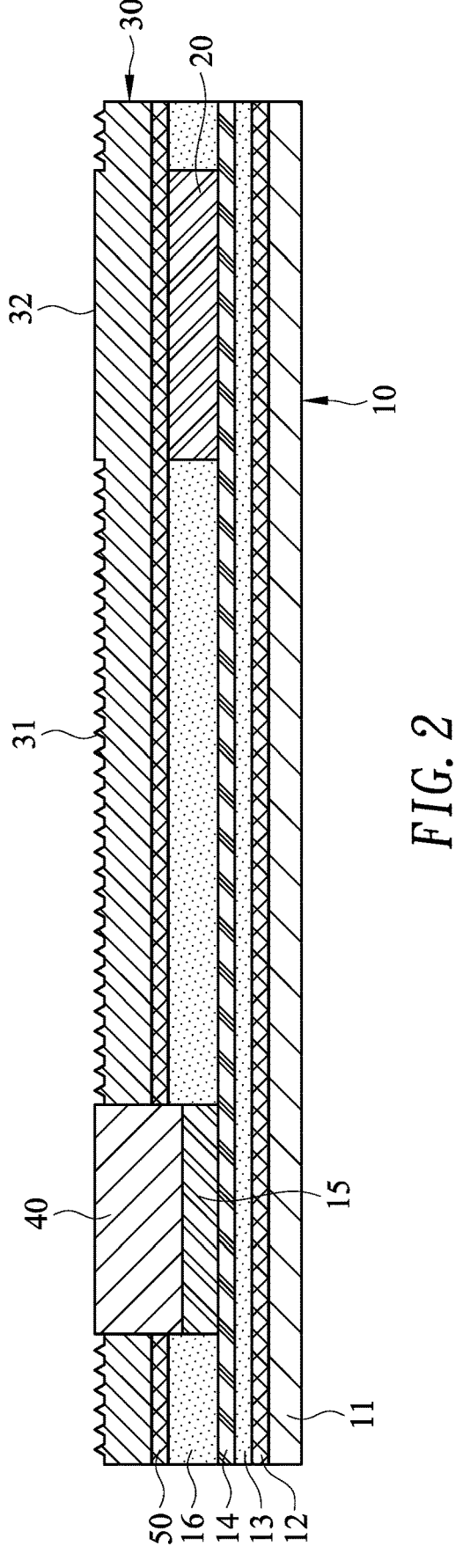
FIG. 2 is a side view in a partial section of the card in FIG. 1.
Figure 3:
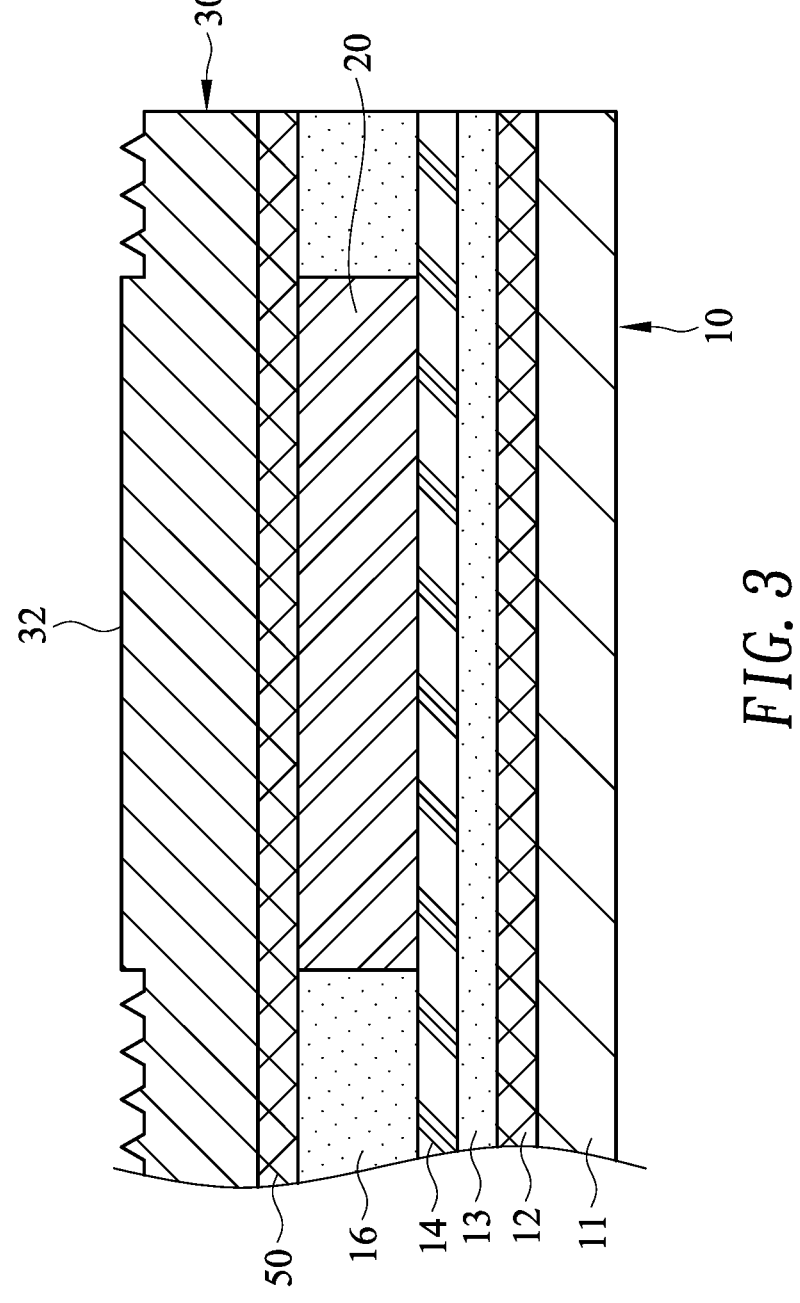
FIG. 3 is a partially enlarged view of the card in FIG. 2.

With reference to FIGS. 1 to 3, a card in accordance with the present invention comprises a main layer 10, a fingerprint sensor 20, a protective layer 30, and an integrated circuit (IC) 40.

The main layer 10 has a circuit formed thereon. In one embodiment, a flexible printed circuit board (FPC) 14 is disposed on the main layer 10 to form the circuit. The fingerprint sensor 20 is used to provide users with the function of sensing their fingerprints and achieving identity verification. The fingerprint sensor 20 is disposed on the FPC 14 and electrically connects to the circuit. The fingerprint sensor 20 has a sensing area. The protective layer 30 covers the main layer 10 and the fingerprint sensor 20 and has a surface. The surface of the protective layer 30 has a first area 31 and a second area 32. A surface roughness of the first area 31 is greater than a surface roughness of the second area 32. The second area 32 covers the sensing area of the fingerprint sensor 20. In one embodiment, the surface roughness of the second area 32 is less or equal to 1.13 μm. The IC 40 is disposed on the FPC 14 of the main layer 10 and electrically connects to the circuit. The protective layer 30 has an opening 301. The IC 40 is aligned with the opening 301 to expose relatively to the protective layer 30, i.e. that the protective layer 30 does not cover the IC 40.

In one embodiment, a manufacturing method of the card in accordance with the present invention is shown in FIGS. 4A to 4I and comprises the following steps, but is not limited thereto.

Figures 4A, 4B, 4C, 4D:
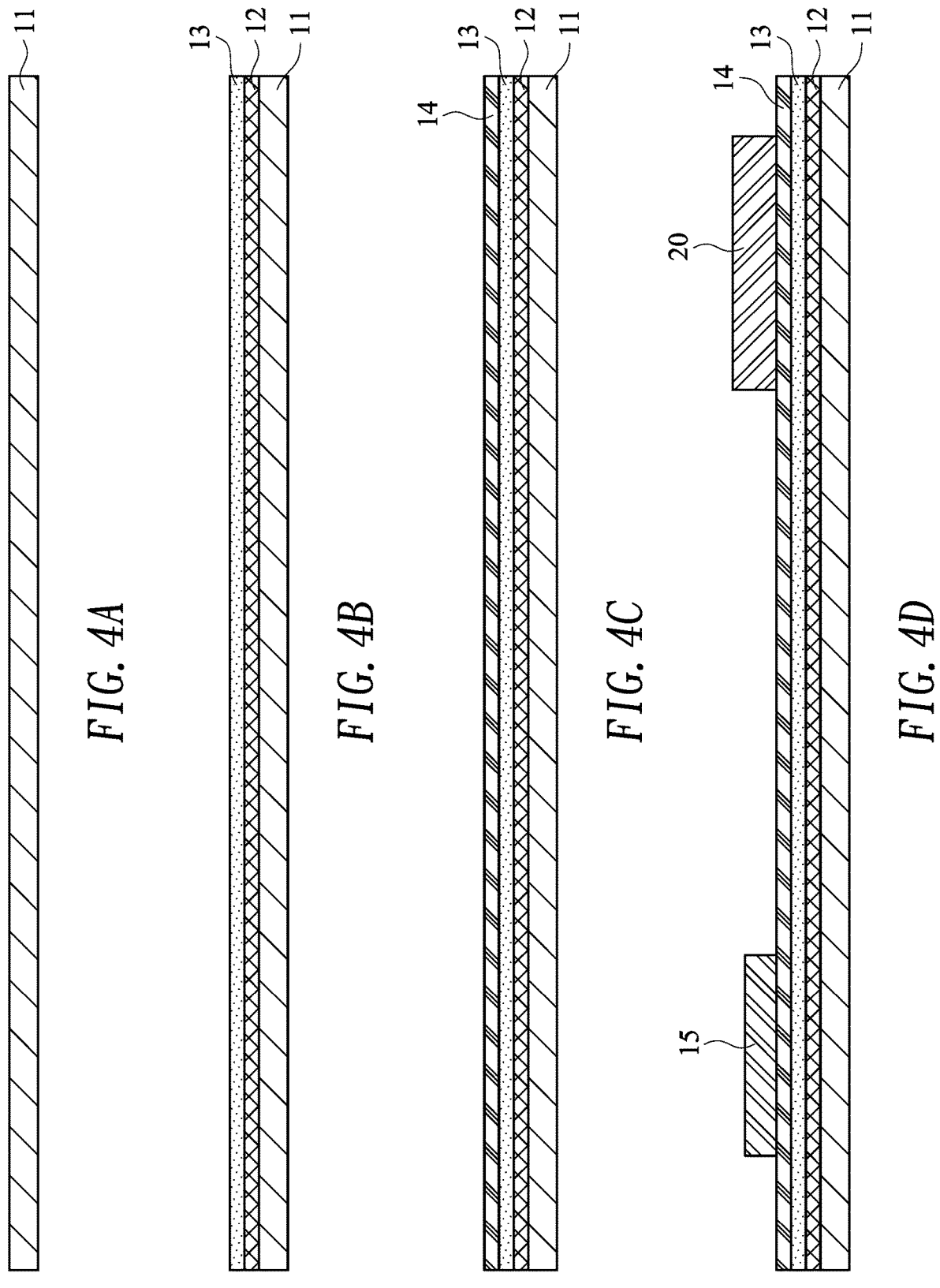
FIGS. 4A to 4I are operational side views in a partial section of a first embodiment of a manufacturing method of the card in accordance with the present invention.

Providing the main layer 10: The FPC 14 is attached to the substrate 11 to form the main layer 10. In one embodiment, a first intermediate layer 13 is attached to the substrate 11 as shown in FIG. 4B. The first intermediate layer 13 may be attached to the substrate 11 through an adhesive layer 12. Then the FPC 14 is attached to the first intermediate layer 13 as shown in FIG. 4C.

Disposing the fingerprint sensor 20 on the main layer 10: As shown in FIG. 4D, the fingerprint sensor 20 is disposed on the FPC 14. A pad 15 may be also disposed on the FPC 14. The fingerprint sensor 20 and the pad 15 electrically connect to the FPC 14. The pad 15 is separated from and does not electrically connect to the fingerprint sensor 20.

Figures 4E, 4F, 4G:
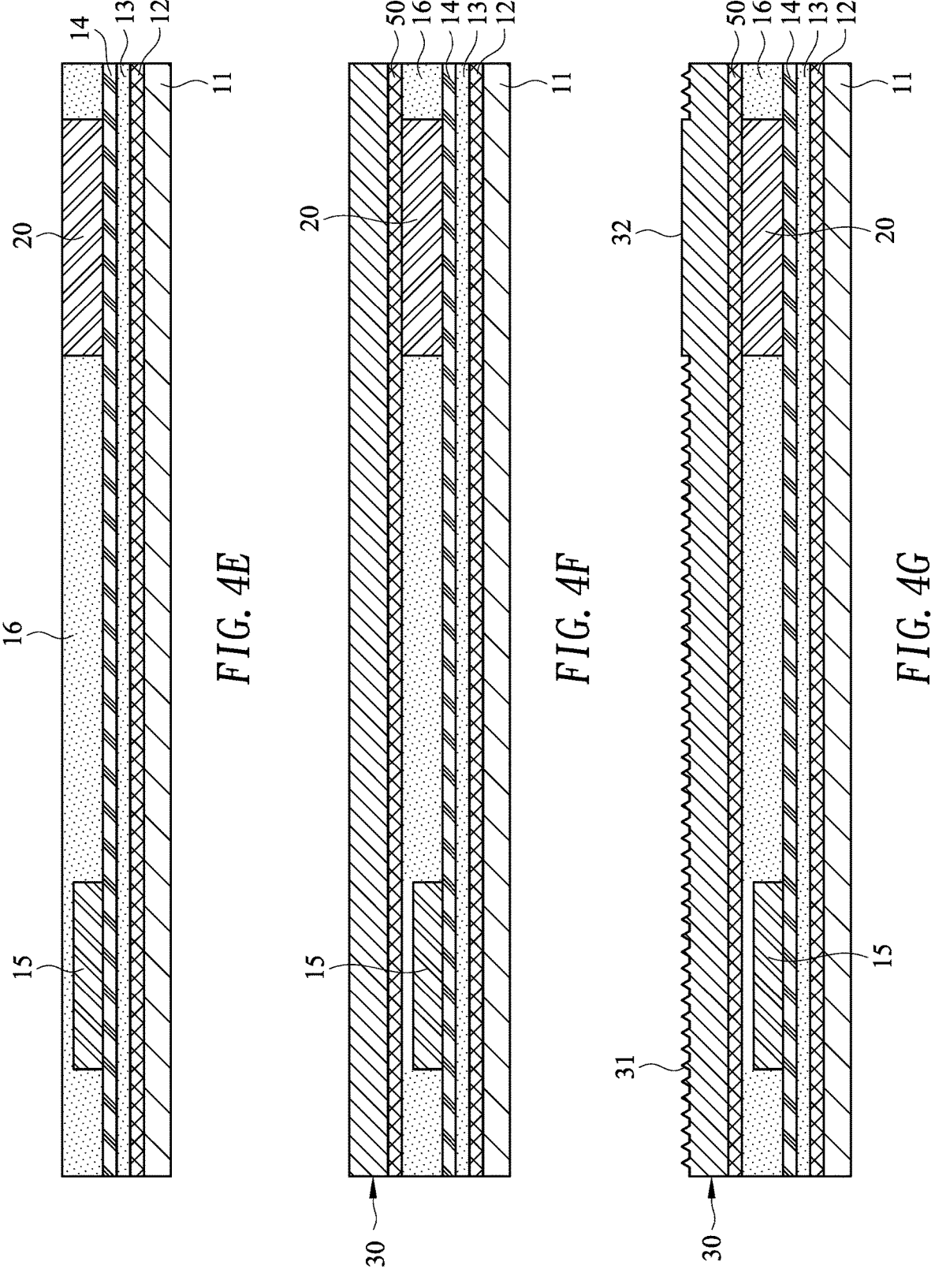

Disposing the protective layer 30 to cover the main layer 10 and the fingerprint sensor 20: A second intermediate layer 16 covers the FPC 14 and the pad 15 as shown in FIG. 4E. The second intermediate layer 16 may or may not cover the fingerprint sensor 20. In the embodiment that the fingerprint sensor 20 is not covered by the second intermediate layer 16, the sensing function of the fingerprint sensor 20 is not influenced by the thickness of the second intermediate layer 16. Then the protective layer 30 covers the second intermediate layer 16 and the fingerprint sensor 20 as shown in FIG. 4F. a gluey layer 50 may be applied between the protective layer 30 and the second intermediate layer 16. The protective layer 30 may be a PVC membrane, PE membrane, or a membrane made of other plastics.

Surface treatment to the surface of the protective layer 30 to form the first area 31 and the second area 32 of the surface of the protective layer 30: There are numerous embodiments for forming the first area 31 and the second area 32, which are described below but not limited thereto.

In one embodiment as shown in FIG. 4G, the surface of the protective layer 30 is roughened by a processing component to form a roughened surface, thus forming the first area 31 and the second area 32. For example, the first area 31 and the second area 32 are formed on the surface of the protective layer 30 by hot pressing or cold pressing using a roller with a predetermined pattern on the surface of a mold for pressing.

In one embodiment as shown in FIG. 4G, a coating layer is applied on the surface of the protective layer 30 to constitute the first area 31 and the second area 32. The coating layer may be applied by printing.

In one embodiment, the entire surface of the protective layer 30 provided in the previous step as shown in FIG. 4F is the second area 32. In this step, the first area 31 is formed by deforming the surface of the protective layer 30 except for corresponding to the sensing area of the fingerprint sensor 20 (as shown in FIG. 4G) by using a workpiece.

In one embodiment, the entire surface of the protective layer 30 provided in the previous step as shown in FIG. 4F is the second area 32. In this step, the first area 31 is formed by applying a coating layer to the surface of the protective layer 30 except for corresponding to the sensing area of the fingerprint sensor 20 (as shown in FIG. 5B).

Figures 5A, 5B:
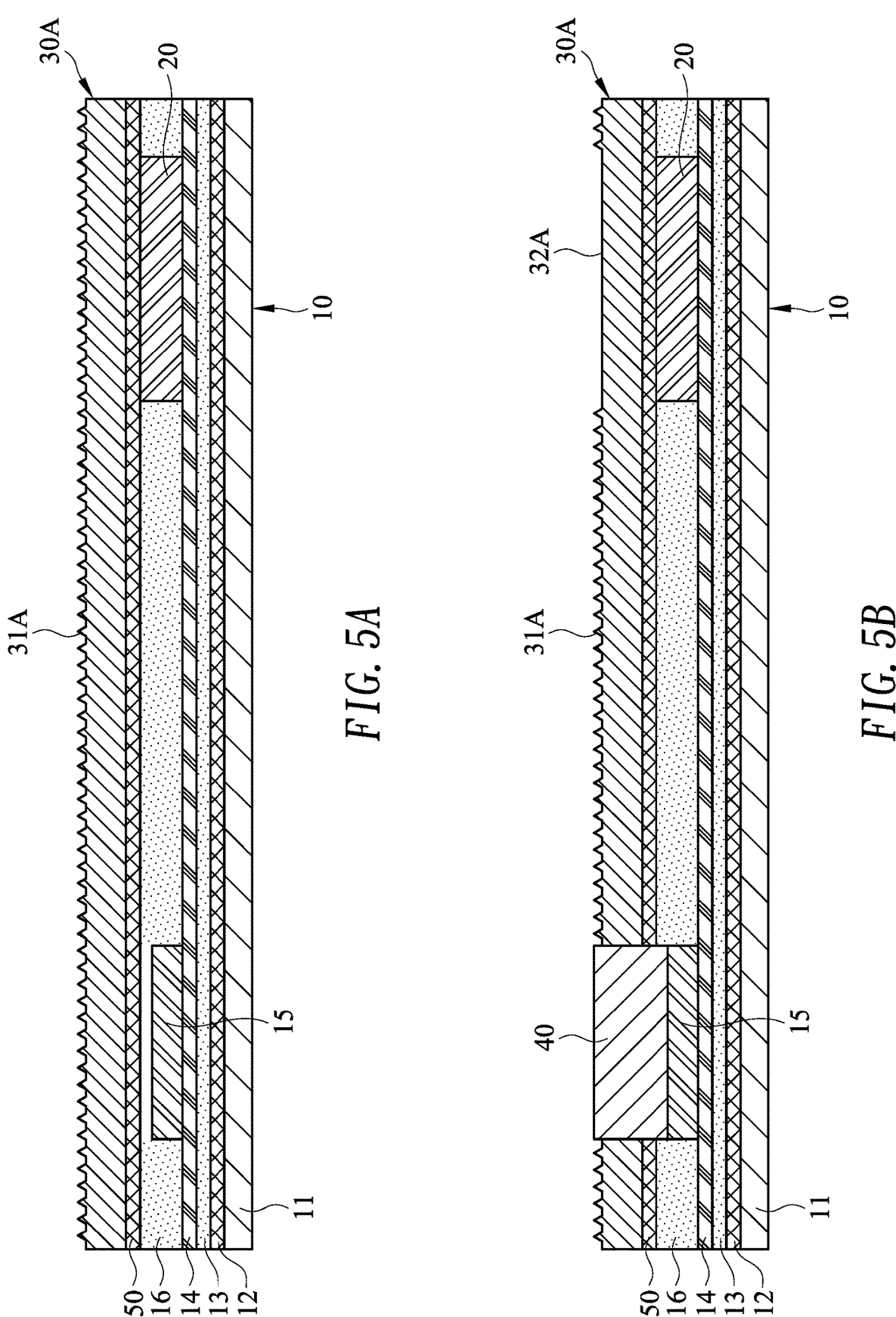
FIGS. 5A to 5B are operational side views in a partial section of two of the processes of a second embodiment of a manufacturing method of the card in accordance with the present invention.

In one embodiment, the entire surface of the protective layer 30 provided in the previous step as shown in FIG. 5A is the first area 31. In this step, the second area 32 is formed by flattening the surface of the protective layer 30 corresponding to the sensing area of the fingerprint sensor 20 (as shown in FIG. 5B) by using a workpiece. Besides using the roller or pressing, the corresponding cutting tool may be also used as the workpiece to perform the grinding or flattening process.

Figure 5C:
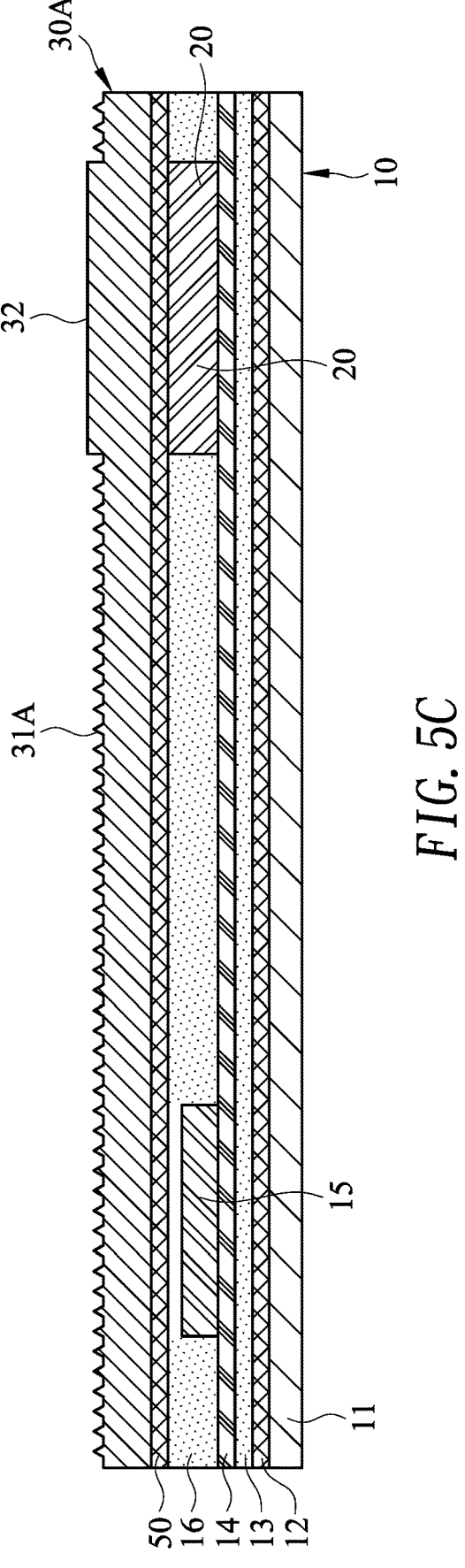
FIG. 5C operational side views in a partial section of one of the processes of a third embodiment of a manufacturing method of the card in accordance with the present invention.

In one embodiment, the entire surface of the protective layer 30 provided in the previous step as shown in FIG. 5A is the first area 31. In this step, the second area 32 is formed by applying a coating layer to the surface of the protective layer 30 corresponding to the sensing area of the fingerprint sensor 20 (as shown in FIG. 5C). Furthermore, the coating layer has a flat surface.

Figure 6:
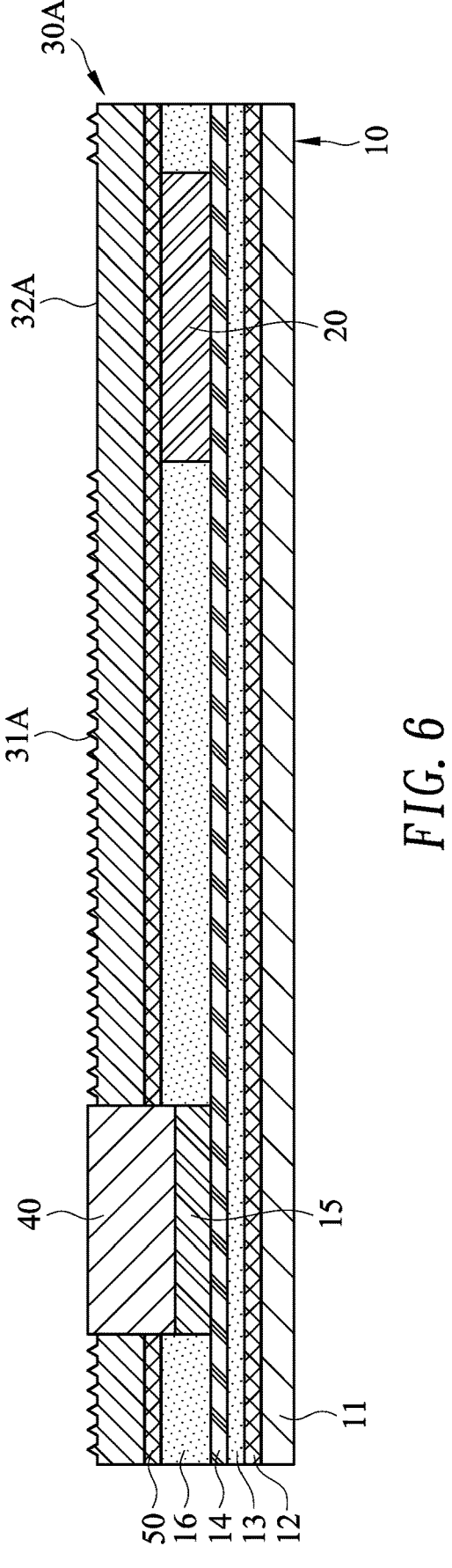
FIG. 6 is a side view in a partial section of a second embodiment of a card in accordance with the present invention.
Figure 7:
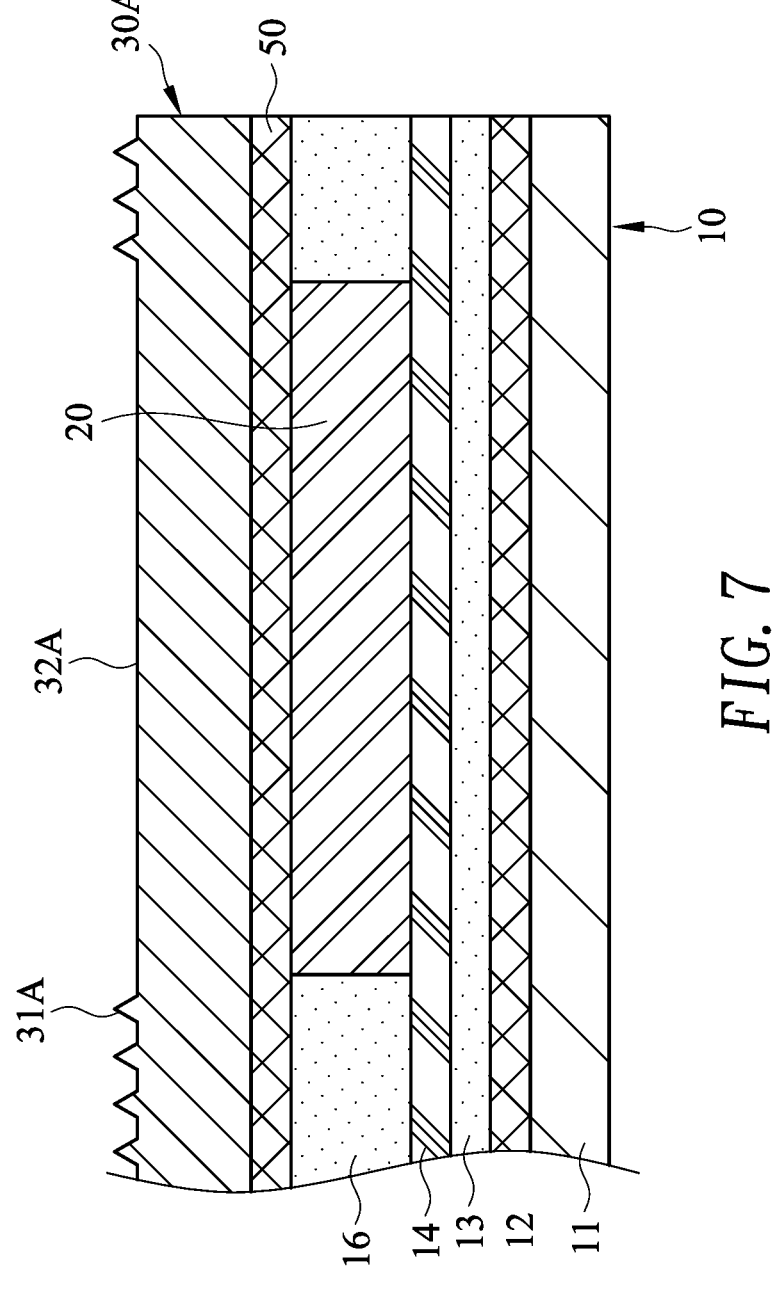
FIG. 7 is a partially enlarged view of the card in FIG. 6.

Based on the above-mentioned different surface treatment methods, the card in accordance with the present invention also has different implementation embodiments, which are hereby explained as follows, but not limited thereto. In one embodiment as shown in FIGS. 2 and 3, the upper surface of the second area of the protection layer 30 is flush with or higher than the ridges of the first area 31. In another embodiment as shown in FIGS. 6 and 7, the upper surface of the second area 32A of the protection layer 30A is lower than the ridges of the first area 31A, or even lower than the valleys of the first area 31A.

In one embodiment, the second area 32, 32A may be further applied to hydrophobic material. The hydrophobic material may contain a fluorosilicon compound mainly composed of siloxane (Si—O—Si) and fluorine, a compound containing fluorine as the main component, a fluorocarbon compound mainly composed of —CF2-/CF2H/—CF3 fluorine-containing groups, silicon dioxide (SiO2), and so on.

Figure 4H:
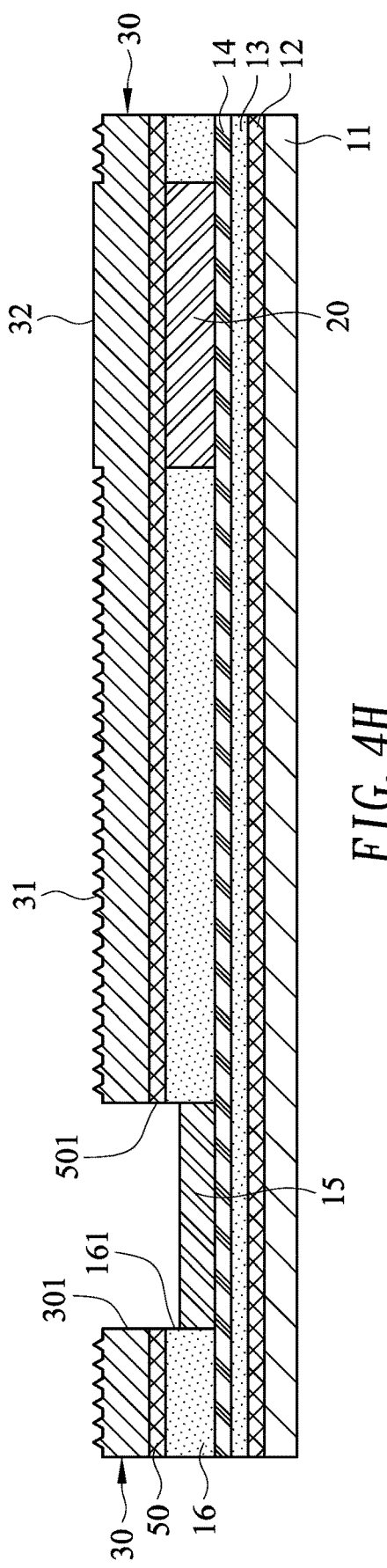
Figure 4I:
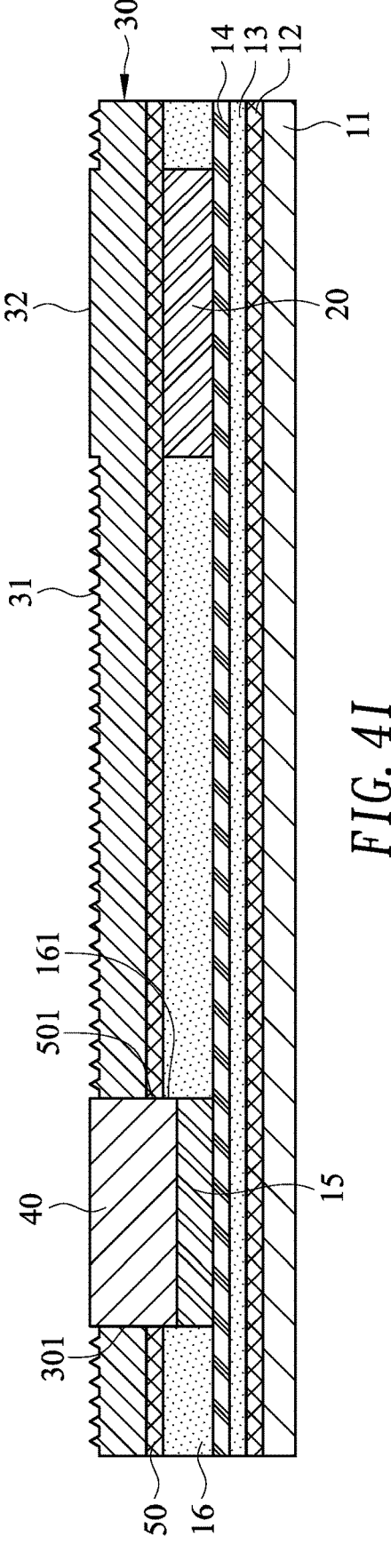

Moreover, after the surface treatment of the protective layer 30 is carried out, the step of setting the IC 40 is carried out. The protective layer 30 has a through hole 301, the gluey layer 50 has a through hole 501, and the second intermediate layer 16 has a through hole 161. The through holes 301, 501, 161 align with and communicate with each other and correspond to the pad 15 (as shown in FIG. 4H). The IC 40 is mounted in the through holes 301, 501, 161 (as shown in FIG. 4I). A contact surface of the IC 40 is exposed to the surface of the protective layer 30.

In conclusion, the surface of the protective layer 30 has the design of the second area 32 corresponding to the sensing area of the fingerprint sensor 20, so that moisture is not easy to stay in the protective layer 30 where corresponds to the sensing area of the fingerprint sensor 20. It effectively reduces the influence of retained moisture on the fingerprint-sensing effect when the user's finger is wet. In addition, the coating of the hydrophobic material further reduces the residual moisture on the second area 32 to improve the quality of fingerprint image capture.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A card comprising:

a main layer having a circuit;

a fingerprint sensor disposed on the main layer, electrically connecting to the circuit of the main layer, and having a sensing area; and a protective layer made of one unitary material, covering the main layer and the fingerprint sensor and having a surface including a first area and a second area, wherein a surface roughness of the first area is greater than a surface roughness of the second area and the second area covers the sensing area of the fingerprint sensor, wherein the first area and the second area are preformed on the protective layer prior to use and before any contact with a finger.

2. The card as claimed in claim 1, wherein the surface roughness of the second area is less than or equal to 1.13 µm.

3. The card as claimed in claim 1, wherein a hydrophobic material is applied to the second area.

4. The card as claimed in claim 2, wherein a hydrophobic material is applied to the second area.

5. The card as claimed in claim 1 further comprising an integrated circuit (IC), wherein the IC is disposed on the main layer; and the protective layer has a through hole formed there through and corresponding to the IC, which allows the IC to be exposed from the protective layer.

6. The card as claimed in claim 2 further comprising an integrated circuit (IC), wherein the IC is disposed on the main layer; and the protective layer has a through hole formed there through and corresponding to the IC, which allows the IC to be exposed from the protective layer.

7. The card as claimed in claim 4 further comprising an integrated circuit (IC), wherein the IC is disposed on the main layer; and the protective layer has a through hole formed there through and corresponding to the IC, which allows the IC to be exposed from the protective layer.

8. A manufacturing method of a card comprising steps of:

a. providing a main layer;

b. disposing a fingerprint sensor on the main layer, wherein the fingerprint sensor has a sensing area;

c. covering a protective layer on the main layer and the fingerprint sensor, wherein the protective layer is made of one unitary material; and d. processing a surface treatment to a surface of the protective layer to form a first area and a second area, wherein the second area covers the sensing area of the fingerprint sensor, and a surface roughness of the first area is greater than a surface roughness of the second area, and the first area and the second area are preformed on the protective layer prior to use and before any contact with a finger.

9. The method as claimed in claim 8, wherein the step d includes a step of deforming the surface of the protective layer by using a workpiece to form the first area and the second area.

10. The method as claimed in claim 8, wherein in the step c, the surface of the protective layer is formed as the second area; and the step d includes a step of deforming the surface of the protective layer except for corresponding to the sensing area of the fingerprint sensor by using a workpiece to form the first area.

11. The method as claimed in claim 8, wherein in the step c, the surface of the protective layer is formed as the first area; and the step d includes a step of deforming the surface of the protective layer corresponding to the sensing area of the fingerprint sensor by using a workpiece to form the second area.

12. The method as claimed in claim 8 further comprising steps of:

e. forming a through hole through the protective layer and communicating to the main layer; and f. disposing an integrated circuit (IC) on the main layer and in the through hole of the protective layer to expose a contact surface of the IC from the protective layer.

* * * * *